(12) United States Patent
Xiao (10) Patent No.: US 10,615,081 B2
(45) Date of Patent: Apr. 7, 2020

(54) FIN TUNNELING FIELD EFFECT TRANSISTOR AND MANUFACTURING METHOD THEREOF

(71) Applicant: SEMICONDUCTOR MANUFACTURING INTERNATIONAL (SHANGHAI) CORPORATION, Shanghai (CN)

(72) Inventor: Deyuan Xiao, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 258 days.

(21) Appl. No.: 14/568,886

(22) Filed: Dec. 12, 2014

(65) Prior Publication Data

US 2015/0340489 A1    Nov. 26, 2015

(30) Foreign Application Priority Data

May 26, 2014 (CN) .......................... 2014 1 0223181

(51) Int. Cl.
*H01L 21/8238* (2006.01)
*H01L 29/66* (2006.01)
(Continued)

(52) U.S. Cl.
CPC .. *H01L 21/823821* (2013.01); *H01L 27/0924* (2013.01); *H01L 29/66356* (2013.01);
(Continued)

(58) Field of Classification Search
CPC .......................... H01L 29/0661; H01L 29/785
See application file for complete search history.

(56) References Cited

U.S. PATENT DOCUMENTS 7,465,976 B2    12/2008  Kavalieros et al.
7,470,578 B2 *  12/2008  Nowak ............... H01L 27/1203
                                              257/E27.112
(Continued)

FOREIGN PATENT DOCUMENTS

| CN | 101969061 A | 2/2011 |
| CN | 102664165 A | 9/2012 |
| CN | 103594496 A | 2/2014 |

OTHER PUBLICATIONS

Machine translation for CN 101969061A (Zang et al.), obtained from ProQuest on Feb. 14, 2018.*

(Continued)

*Primary Examiner* — Erik T. K. Peterson
(74) *Attorney, Agent, or Firm* — Innovation Counsel LLP (57) ABSTRACT

A fin tunneling field effect transistor (TFET) is disclosed. The fin TFET includes a semiconductor body extending in a first direction on a substrate, wherein the semiconductor body constitutes a channel of the fin TFET. The fin TFET also includes a source and a drain disposed at opposite ends of the semiconductor body, wherein the source is doped with a first dopant type and the drain is doped with a second dopant type, and the first dopant type is different from the second dopant type. The fin TFET further includes a gate disposed on at least two sides of the channel, wherein a portion of the source is disposed in contact with a portion of the channel.

3 Claims, 6 Drawing Sheets (51) Int. Cl.
*H01L 29/739* (2006.01)
*H01L 27/092* (2006.01)
*H01L 27/12* (2006.01)
*H01L 29/08* (2006.01)
*H01L 21/84* (2006.01)
*H01L 29/06* (2006.01)

(52) U.S. Cl.
CPC ........ *H01L 29/7391* (2013.01); *H01L 21/845* (2013.01); *H01L 27/1211* (2013.01); *H01L 29/0657* (2013.01); *H01L 29/083* (2013.01)

(56) References Cited

U.S. PATENT DOCUMENTS

| | | | |
|---|---|---|---|
| 8,368,127 | B2 | 2/2013 | Zhu et al. |
| 2007/0099353 | A1* | 5/2007 | Thean ............... H01L 21/845 438/149 |
| 2007/0108536 | A1* | 5/2007 | Ieong ............... H01L 21/845 257/401 |
| 2007/0287256 | A1* | 12/2007 | Chang ............. H01L 29/66795 438/283 |
| 2008/0185650 | A1* | 8/2008 | Chen ............... H01L 29/66795 257/348 |
| 2008/0224224 | A1* | 9/2008 | Vandenderghe ....... B82Y 10/00 257/365 |
| 2009/0078997 | A1* | 3/2009 | Greene ........... H01L 21/823807 257/347 |
| 2009/0101975 | A1* | 4/2009 | Holz ............. H01L 21/823418 257/347 |
| 2009/0184369 | A1* | 7/2009 | Zhu ................. H01L 29/7391 257/347 |
| 2010/0025766 | A1* | 2/2010 | Nuttinck ............ H01L 29/7391 257/351 |
| 2010/0140589 | A1* | 6/2010 | Ionescu ................. B82Y 10/00 257/24 |
| 2010/0200916 | A1* | 8/2010 | Gossner ............... H01L 29/083 257/335 |
| 2011/0147838 | A1* | 6/2011 | Gossner .......... H01L 29/66356 257/345 |
| 2011/0266622 | A1* | 11/2011 | Luning ............ H01L 29/66795 257/347 |
| 2012/0196410 | A1* | 8/2012 | Tsai .................. H01L 29/66545 438/151 |
| 2013/0119395 | A1 | 5/2013 | Bhuwalka et al. |
| 2013/0221407 | A1* | 8/2013 | Hou ................ H01L 29/66803 257/192 |
| 2014/0061734 | A1* | 3/2014 | Basker ............ H01L 29/66795 257/288 |
| 2014/0138744 | A1* | 5/2014 | Kotlyar ................ H01L 29/785 257/192 |
| 2014/0220748 | A1* | 8/2014 | Huang ............ H01L 29/66356 438/232 |
| 2014/0252407 | A1* | 9/2014 | Anghel ............. H01L 29/7833 257/105 |
| 2015/0179800 | A1* | 6/2015 | Biswas ............... H01L 29/7855 365/189.011 |
| 2016/0268401 | A1* | 9/2016 | Aleksov ............. H01L 29/7869 |

OTHER PUBLICATIONS

Katsuhiro Tomioka et al., "Steep-slope Tunnel Field-Effect Transistors using III-V Nanowire/Si Heterojunction", 2012 Symposium on VLSI Technology Digest of Technical Papers, 978-1-4673-0847-2/12, 2012 IEEE, pp. 47-48.

* cited by examiner

FIN TUNNELING FIELD EFFECT TRANSISTOR AND MANUFACTURING METHOD THEREOF

CROSS-REFERENCE TO RELATED APPLICATION

This application claims priority to Chinese Patent Application No. 201410223181.4 filed on May 26, 2014, the disclosure of which is incorporated herein by reference in its entirety.

BACKGROUND

Technical Field

The present disclosure generally relates to a semiconductor device and manufacturing method thereof. More particularly, it discloses a fin tunneling field effect transistor (fin TFET) and a method of manufacturing the same.

Description of the Related Art

Continuous scaling in the dimensions of semiconductor devices can lead to improvements in circuit performance, power savings, and circuit integration.

For example, the feature sizes of conventional metal-oxide-semiconductor field effect transistors (MOSFETs) are continuously reduced to improve Very Large Scale Integration (VLSI) performance and reduce device costs. However, when the device dimensions are reduced to the sub-micrometer or nanometer scale, the short channel effect and its negative impact becomes more significant. To mitigate the negative impact of the short channel effect, tunneling field effect transistors (TFETs) may be used to replace conventional MOSFETs.

Figure 1A:
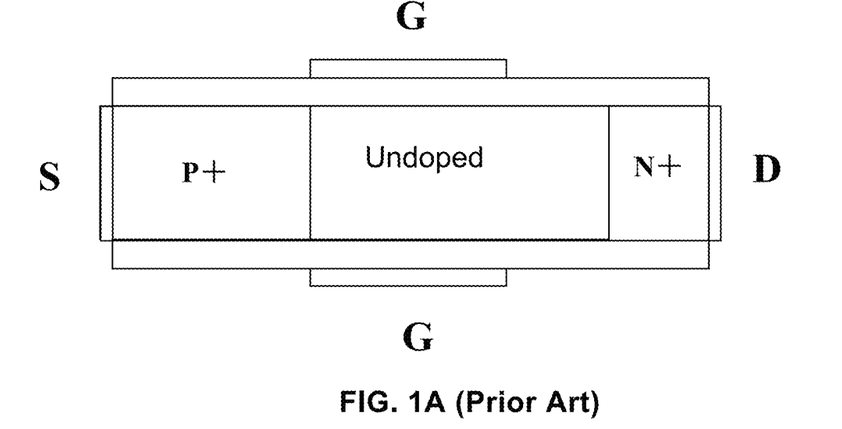
FIG. 1A illustrates a cross-sectional view of a conventional TFET taken along the channel direction.

A TFET is basically a gated reverse-biased PIN diode. FIG. 1A illustrates a cross-sectional view of a conventional TFET taken along the channel direction.

The symbols S, D, and G denote the source, drain, and gate, respectively. The dopant types in the source and drain of the TFET are different from those in a conventional MOSFET. For example, in the n-type TFET (nTFET) shown in FIG. 1A, the $N^+$ doped region is the drain and the $P^+$ doped region is the source.

Figure 1B:
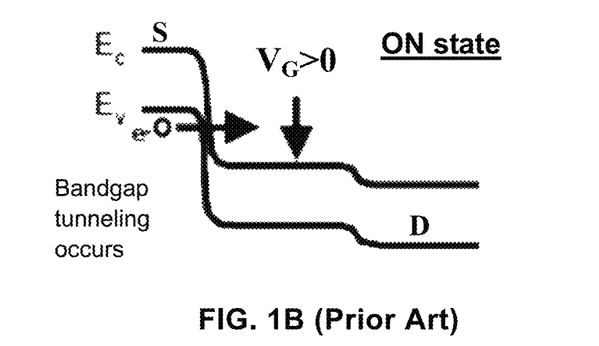
FIGS. 1B and 1C illustrate the basic working principle of the nTFET of FIG. 1A when the nTFET is in an ON state and an OFF state.
Figure 1C:
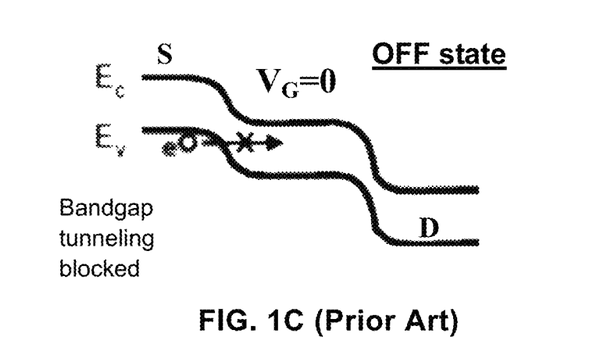

FIGS. 1B and 1C illustrate the basic working principle of the nTFET of FIG. 1A.

Referring to FIG. 1B, when the nTFET is in an ON state, a positive bias is applied to the gate ($V_G>0$). This causes the potential of the channel to decrease, and the barrier layer between the source and channel to become thinner. Subsequently, electrons may tunnel from the source to the channel, and then drift to the drain under the influence of the electric field.

Referring to FIG. 1C, when the nTFET is in an OFF state ($V_G=0$), the barrier layer between the source and channel increases in thickness, and electron tunneling does not occur.

Compared to the conventional MOSFET, the TFET can reduce subthreshold swing (SS). Accordingly, the TFET can reduce on/off voltage swings. The source injection of the conventional MOSFET is based on diffusion-drift mechanism. Since the carrier in the conventional MOSFET follows a Fermi-Dirac distribution, the SS will be proportional to kT/q. At room temperature conditions, the SS may be limited to 60 mV/dec. However, since the source injection of the TFET is based on bandgap tunneling, the SS of the TFET is not limited to 60 mV/dec (i.e. the SS of the TFET may exceed 60 mV/dec).

The TFET has low leakage current, low SS, lower power consumption, among other desirable features. However, since a conventional TFET is based on lateral tunneling, the tunneling area and probabilistic tunneling may be limited in the conventional TFET. In particular, the applications of the TFET may be limited when the ON current is small.

In a conventional transistor, the current is controlled through the gate. In particular, the conventional transistor is a planar structure, and as such, the switching on/off of the circuit can only be controlled on one side of the gate. With the scaling in the technology process node, the channel length of the MOSFET is reduced, and the distance between the drain and source is reduced. As a result, the gate has less control over the channel. For example, it becomes increasingly difficult for the gate voltage to "pinch off" the channel, and as a result, subthreshold current leakage is more likely to occur.

To address the deficiencies in the planar structure of the conventional transistor, a fin field effect transistor (FinFET) has been proposed. In a FinFET, the gate is formed having a fin-like shape (a forked three-dimensional structure). Unlike the conventional transistor, the switching on/off of the circuit can be controlled on both sides of the gate in the FinFET. Accordingly, the FinFET design can significantly improve circuit control, reduce current leakage, and further reduce the gate length of the transistor.

SUMMARY

The present disclosure discloses a fin TFET having a low SS and a high on-state current. The three-dimensional fin TFET has a higher on-state current compared to a planar structure conventional TFET.

The fin TFET may be a complementary fin TFET including an N-type fin TFET and a P-type fin TFET. Specifically, the active regions of the N-type fin TFET and the P-type fin TFET may include semiconductor materials having high electron mobility and high hole mobility, respectively. The semiconductor materials also have a narrow bandgap. Accordingly, the on-state current of the fin TFET can be further increased.

According to an embodiment of the inventive concept, a fin tunneling field effect transistor (TFET) is provided. The fin TFET includes: a semiconductor body extending in a first direction on a substrate, wherein the semiconductor body constitutes a channel of the fin TFET; a source and a drain disposed at opposite ends of the semiconductor body, wherein the source is doped with a first dopant type and the drain is doped with a second dopant type, and the first dopant type is different from the second dopant type; and a gate disposed on at least two sides of the channel, wherein a portion of the source is disposed in contact with a portion of the channel.

In one embodiment, the first dopant type may be one of an N-type dopant and a P-type dopant, and the second dopant type may be the other one of the N-type dopant and the P-type dopant.

In one embodiment, the channel may be doped.

In one embodiment, the gate may be disposed above the channel.

In one embodiment, a gate oxide may be disposed between the gate and the channel.

In one embodiment, a spacer may be disposed on at least one side of the gate.

In one embodiment, a dopant concentration of each of the source and the drain may be equal to or greater than $1 \times 10^{19}$ cm$^{-3}$.

In one embodiment, the first dopant type may include one of donor atoms and acceptor atoms, and the second dopant type may include the other one of the donor atoms and the acceptor atoms.

According to another embodiment of the inventive concept, a complementary fin tunneling field effect transistor (TFET) is provided. The complementary fin TFET includes a fin TFET of a first type and a second fin TFET of a second type. The fin TFET of the first type includes: a first semiconductor body extending in a first direction on a substrate, wherein the first semiconductor body constitutes a first channel of the fin TFET of the first type; a first source and a first drain disposed at opposite ends of the first semiconductor body, wherein the first source is doped with a first dopant type and the first drain is doped with a second dopant type, and the first dopant type is different from the second dopant type; and a first gate disposed on at least two sides of the first channel, wherein a portion of the first source is disposed in contact with a portion of the first channel. The fin TFET of the second type includes: a second semiconductor body extending in the first direction on the substrate, wherein the second semiconductor body constitutes a second channel of the fin TFET of the second type; a second source and a second drain disposed at opposite ends of the second semiconductor body, wherein the second source is doped with the second dopant type and the second drain is doped with the first dopant type; and a second gate disposed on at least two sides of the second channel, wherein a portion of the second source is disposed in contact with a portion of the second channel.

In one embodiment, the first type may be one of an N-type and a P-type, and the second type may be the other one of the N-type and the P-type, and the first dopant type may be one of an N-type dopant and a P-type dopant, and the second dopant type may be the other one of the N-type dopant and the P-type dopant.

According to a further embodiment of the inventive concept, a method of manufacturing a fin tunneling field effect transistor (TFET) is provided. The method includes: providing a substrate; forming a semiconductor body extending in a first direction on the substrate, wherein the semiconductor body constitutes a channel of the fin TFET; forming a gate on at least two sides of the channel; and forming a source and a drain at opposite ends of the semiconductor body, wherein the source is doped with a first dopant type and the drain is doped with a second dopant type, wherein the first dopant type is different from the second dopant type, and wherein a portion of the source is disposed in contact with a portion of the channel.

In one embodiment, the channel may be doped.

In one embodiment, the gate may be disposed above the channel.

In one embodiment, the method may further include forming a gate oxide between the gate and the channel.

In one embodiment, the method may further include forming a spacer on at least one side of the gate.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that when an element or layer is referred to as "in", "adjacent to", "connected to", or "coupled to" another element or layer, it can be directly on the other element or layer, adjacent, connected or coupled to the other element or layer. In some instances, one or more intervening elements or layers may be present. In contrast, when an element is referred to as being "directly on", "directly adjacent to", "directly connected to", or "directly coupled to" another element or layer, there are no intervening elements present or layer. It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

Spatially relative terms, such as "beneath", "below", "lower", "above", "upper" and the like, may be used herein for ease of description to describe one element or feature's spatial relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

Exemplary embodiments are described herein with reference to cross-sectional illustrations that are schematic illustrations of idealized exemplary embodiments (and intermediate structures) of the inventive concept. As such, variations from the shapes of the illustrations as a result of, for example, manufacturing techniques and/or tolerances, are to be expected. Thus, the exemplary embodiments should not be construed as being limited to the particular shapes of regions illustrated herein, but may also include deviations in shapes that result, for example, from manufacturing tolerances. The regions illustrated in the figures are schematic in nature, and their shapes are not intended to illustrate the actual shape of a region of a device, and should not be construed to limit the scope of the inventive concept.

It should be understood that the inventive concept is not limited to the embodiments described herein. Rather, the inventive concept may be modified in different ways to realize different embodiments.

Figure 2:
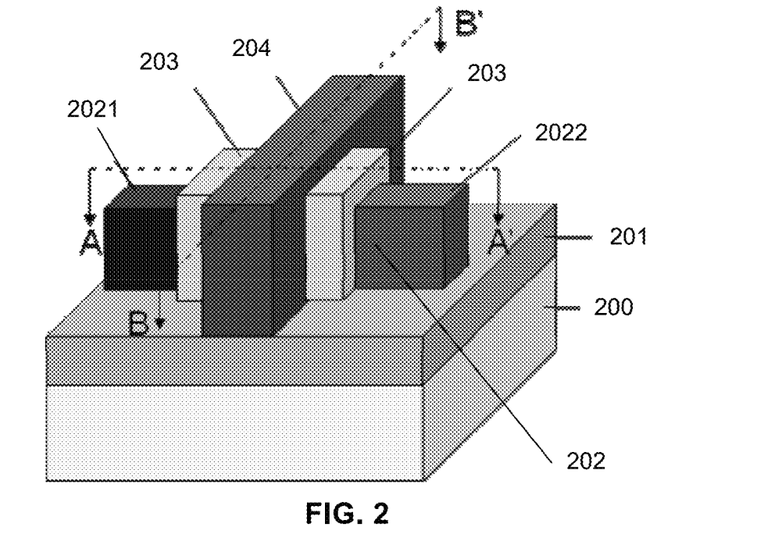
FIG. 2 is a schematic diagram of a fin TFET according to an embodiment.

FIG. 2 is a schematic diagram of a fin TFET according to an embodiment. As shown in FIG. 2, the fin TFET includes a buried oxide (BOX) 201 disposed on a substrate 200, and a fin 202 disposed on the BOX 202. The substrate 200 may be a silicon substrate. The fin 202 includes a first region 2021 disposed at one end of the fin and a second region 2022 disposed at the other end of the fin. The first region 2021 and the second region 2022 are doped with different dopant types. For example, in one embodiment, the first region 2021 may include $N^+$ Ge or SiGe, and the second region 2022 may include $P^+$ Ge or SiGe. Each of the first region 2021 and the second region 2022 may serve as a source or a drain. The portion of the fin 202 between the first region 2021 and the second region 2022 constitutes the channel of the fin TFET.

In one embodiment, the channel may be lightly-doped. Since the source (one of the first/second regions 2021/2022) is formed in direct contact with the channel, the electron tunneling area is therefore increased.

The fin TFET further includes a gate 204 formed over a portion of the fin 202 (specifically, the channel). The gate 204 is separated from the fin 202 by a spacer 203. As shown in FIG. 2, the gate 204 is formed having a three-dimensional structure.

During operation of the fin TFET, a voltage is applied to the gate so as to produce electron tunneling between the source and drain. The three-dimensional structure of the gate improves the gate control over the channel, by making it easier for the gate voltage to "pinch off" the channel. As a result, the subthreshold current leakage is inhibited in the fin TFET.

In the example of FIG. 2, the gate 204 is formed in a wrap-around manner. Specifically, the gate 204 is formed on three sides of the channel. Nevertheless, the inventive concept is not limited thereto. It is noted that the gate 204 may be formed surrounding the channel in different configurations, so long as the fin TFET is formed having a three-dimensional structure. In one embodiment, the gate 204 may be formed on two sides of the channel. In another embodiment, the gate 204 may be formed completely surrounding all sides of the channel.

Figure 3:
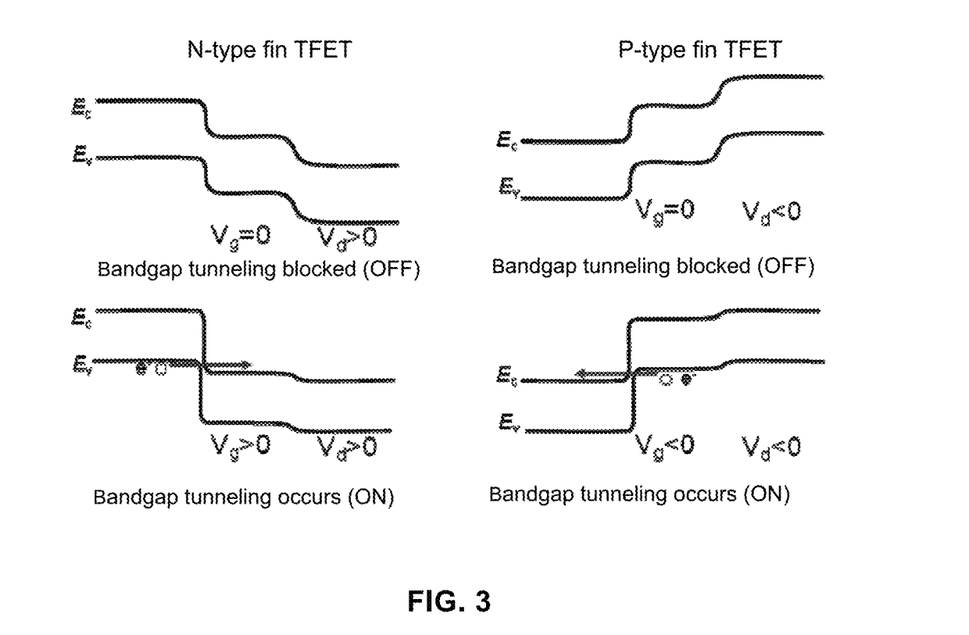
FIG. 3 illustrates the characteristic curves (bandgap diagrams) for an N-type fin TFET and a P-type fin TFET according to an embodiment.

FIG. 3 illustrates the characteristic curves (bandgap diagrams) for an N-type fin TFET and a P-type fin TFET according to an embodiment. In the N-type fin TFET, the source is formed of P-doped SiGe, the drain is formed of N-doped SiGe, and the gate is formed of N-type Ge. In the P-type fin TFET, the source is formed of N-doped SiGe, the drain is formed of P-doped SiGe, and the gate is formed of P-type Ge.

In the example of FIG. 3, the materials in the N-type and P-type fin TFETs are based on Ge, but the inventive concept is not limited thereto. It should be noted that other types of appropriate materials may be used instead of Ge-based materials.

Figure 4:
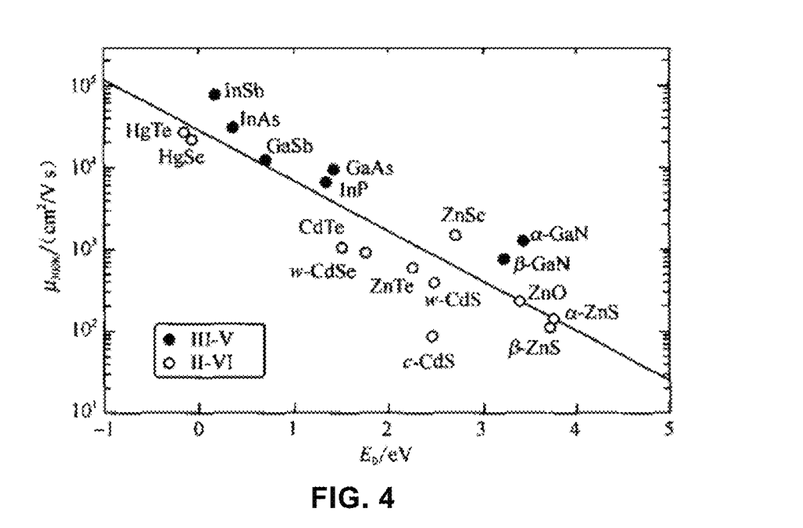
FIG. 4 is a graph illustrating the relationship between carrier mobility and lowest direct bandgap energy $E_0$ for some semiconductor materials under room temperature conditions.

FIG. 4 is a graph illustrating the relationship between carrier mobility and lowest direct bandgap energy $E_0$ for some semiconductor materials under room temperature conditions. Referring to FIG. 4, the solid line is obtained by fitting a minimum quadratic relation: $\ln \mu_{300K} = 10.3 - 1.41 E_0$.

A semiconductor material having a high electron mobility and a narrow bandgap may be used to form the active region of the N-type fin TFET, and a semiconductor material having a high hole mobility and a narrow bandgap may be used to form the active region of the P-type fin TFET, so as to improve the on-state current of the device.

As shown in FIG. 4, GaSb is a narrow direct bandgap semiconductor material that has high carrier (hole) mobility when a weak electric field is applied. InSb is a narrow direct bandgap semiconductor material that has high carrier (electron) mobility when a weak electric field is applied.

As such, GaSb and InSb are suitable materials for forming the fin TFETs. In one embodiment, the P-type fin TFET may include GaSb, and the N-type fin TFET may include InSb.

The inventive concept also extends to a complementary fin TFET including an N-type fin TFET and a P-type fin TFET. Compared to a single fin TFET, the complementary fin TFET provides higher on-state current and improved performance.

Figure 5:
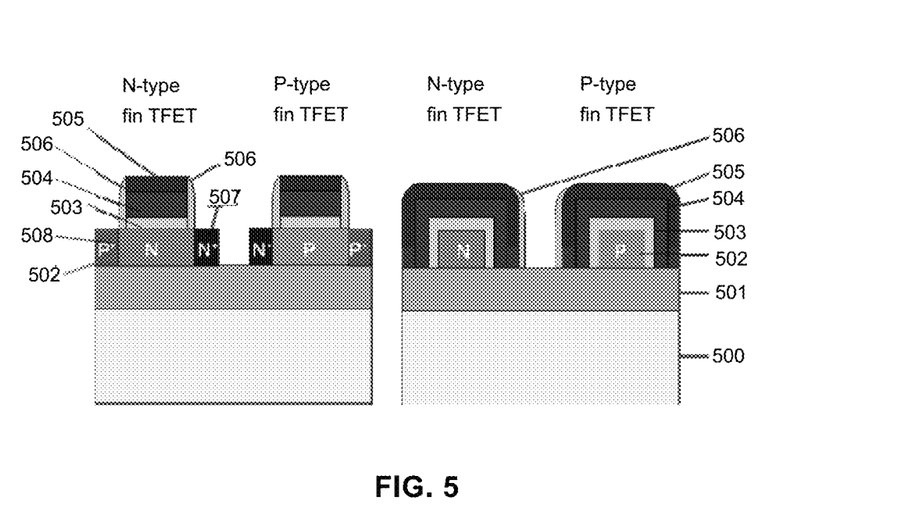
FIG. 5 illustrates cross-sectional views of a complementary fin TFET including an N-type fin TFET and a P-type fin TFET according to an embodiment.

FIG. 5 illustrates cross-sectional views of a complementary fin TFET including an N-type fin TFET and a P-type fin TFET according to an embodiment. The example of FIG. 5 consists of two fin TFETs whereas the example of FIG. 2 consists of a single fin TFET.

The left cross-sectional view in FIG. 5 is taken along a first direction (similar to that of line A-A' of FIG. 2), and the right cross-sectional view in FIG. 5 is taken along a second direction (similar to that of line B-B' of FIG. 2). Specifically, the line A-A' intersects the source-drain of the fin TFET in a vertical direction, and the line B-B' intersects the gate of the fin TFET in a vertical direction.

Referring to FIG. 5, each of the N-type fin TFET and the P-type fin TFET includes a semiconductor body 502 disposed on a substrate. The substrate may include a base substrate 500 and a buried oxide (BOX) 501. The semiconductor body 502 constitutes the fin portion of the fin TFET. The semiconductor body 502 extends along a longitudinal direction and serves as the channel of the fin TFET. Specifically, the semiconductor body 502 in the N-type fin TFET area serves as the channel for the N-type fin TFET, and the semiconductor body 502 in the P-type fin TFET area serves as the channel for the P-type fin TFET.

In the N-type fin TFET, a gate 504 is formed surrounding a first channel, the first channel includes an N-type semiconductor material, and a drain 507 is $N^+$ doped and a source 508 is $P^+$ doped.

In the P-type fin TFET, a gate 504 is formed surrounding a second channel, the second channel includes a P-type semiconductor material, and a drain 507 is $P^+$ doped and a source 508 is $N^+$ doped.

The first and second channels may be lightly doped.

As shown in FIG. 5, a gate oxide 503 is formed between the gate 504 and the channel 502 so as to insulate the gate 504 from the channel 502. A spacer 506 is formed on at least one side of the gate 504, and a gate hard mask 505 is formed on a top portion of the gate 504.

In some particular embodiments, one or more of the gate oxide 503, spacer 506, and gate hard mask 505 may be omitted.

Next, a method of manufacturing the complementary fin TFET of FIG. 5 will be described with reference to FIGS. 6A through 6H. Specifically, FIGS. 6A through 6H depict cross-sectional views of the complementary fin TFET at different stages of fabrication. In each figure, the left cross-sectional view is taken along the first direction (similar to that of line A-A' of FIG. 2), and the right cross-sectional view is taken along the second direction (similar to that of line B-B' of FIG. 2). It should be noted that the method described in FIGS. 6A through 6H may also be used to manufacture a single fin TFET.

Figure 6A:
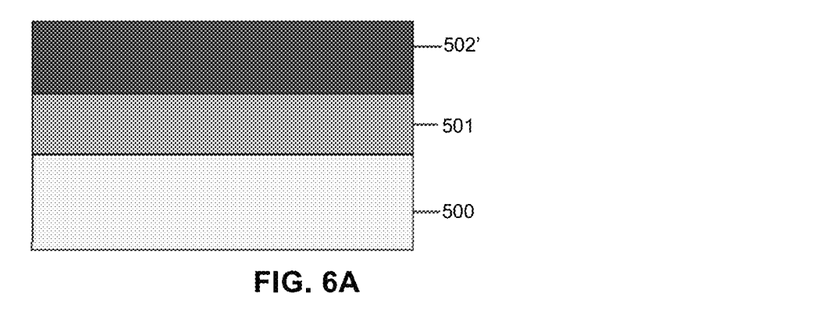
FIGS. 6A, 6B, 6C, 6D, 6E, 6F, 6G, and 6H depict cross-sectional views of the complementary fin TFET of FIG. 5 at different stages of fabrication according to an exemplary manufacturing method.

Referring to FIG. 6A, a substrate is provided. The substrate includes a base substrate 500, a buried oxide (BOX) 501, and a semiconductor layer 502'. The base substrate 500 is formed of a semiconductor material, for example, silicon. The BOX 501 is disposed on the base substrate 500, and a thickness of the BOX 501 may range from about 20 nm to about 50 nm. The semiconductor layer 502' is disposed on the BOX 501. The semiconductor layer 502' may be formed of another semiconductor material, for example, Ge. The semiconductor layer 502' is undoped, and a thickness of the semiconductor layer 502' may range from about 10 nm to about 100 nm.

In the example of FIG. 6A, the substrate is a germanium-on-insulator (GOI) substrate.

In another embodiment, the substrate may be a silicon-on-insulator (SOI) substrate.

It should be noted that other types of substrates may be used, such as monocrystalline silicon substrates.

Figure 6B:
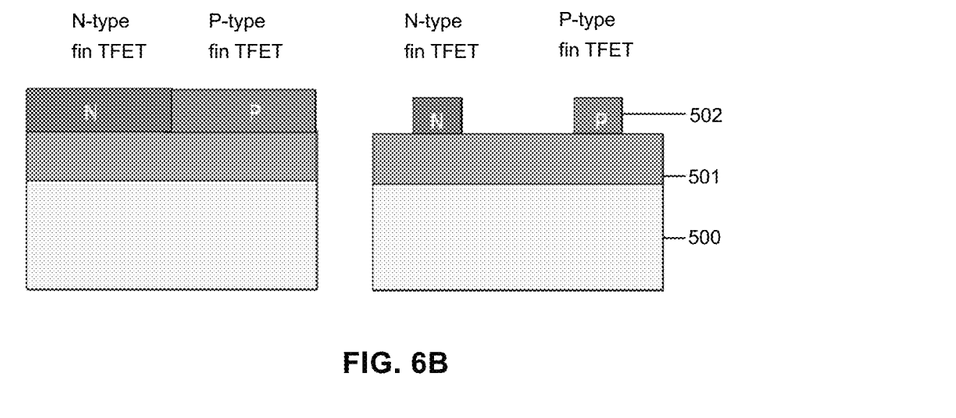

Next, referring to FIG. 6B, the semiconductor layer 502' is etched through a mask (not shown). N-well and P-well implantation are then performed on the remaining portions of the etched semiconductor layer 502', so as to form a semiconductor body 502 in the respective N-type fin TFET area and P-type fin TFET area. The semiconductor body 502 constitutes the fin portion of the fin TFET. The semiconductor body 502 extends along a longitudinal direction and serves as the channel of the fin TFET. Specifically, the semiconductor body 502 in the N-type fin TFET area serves as the channel for the N-type fin TFET, and the semiconductor body 502 in the P-type fin TFET area serves as the channel for the P-type fin TFET.

In one embodiment, the semiconductor body 502 in the N-type fin TFET may be lightly-doped N-type Ge, and the semiconductor body 502 in the P-type fin TFET may be lightly-doped P-type Ge.

It is noted that the semiconductor body 502 may be formed using a combination of photolithography, etching, ion implantation, and/or other techniques known to those skilled in the art.

Referring to the cross-sectional view on the right of FIG. 6B, two fins (semiconductor bodies 502) corresponding respectively to the N-type fin TFET and the P-type fin TFET have been illustrated. However, it should be noted that the number of fins and fin TFETs are merely exemplary, and that the inventive concept need not be limited to the above number. For example, in one embodiment, only one fin (corresponding to a single fin TFET) may be formed. In another embodiment, more than two fins (corresponding to more than fin TFETs) may be simultaneously formed. Further, as those skilled in the art will appreciate, the structure and shape of the fins need not be limited to the configuration shown in FIG. 6B, but may be modified in various ways depending on the design and layout of the fin TFETs.

Additionally, it should be noted that the relative positions of the N-channel and the P-channel (semiconductor bodies 502) in FIG. 6B have been illustrated for clarity and ease of description. In the example of FIG. 6B, the N-channel and the P-channel (semiconductor bodies 502) are shown disposed in a straight line and parallel to each other. However, it should be noted that in other embodiments, the N-channel and the P-channel may be formed in a staggered manner or intersecting each other. In other words, in those other embodiments, the fins of the N-type fin TFET and the P-type fin TFET may be formed intersecting each other.

Figure 6C:
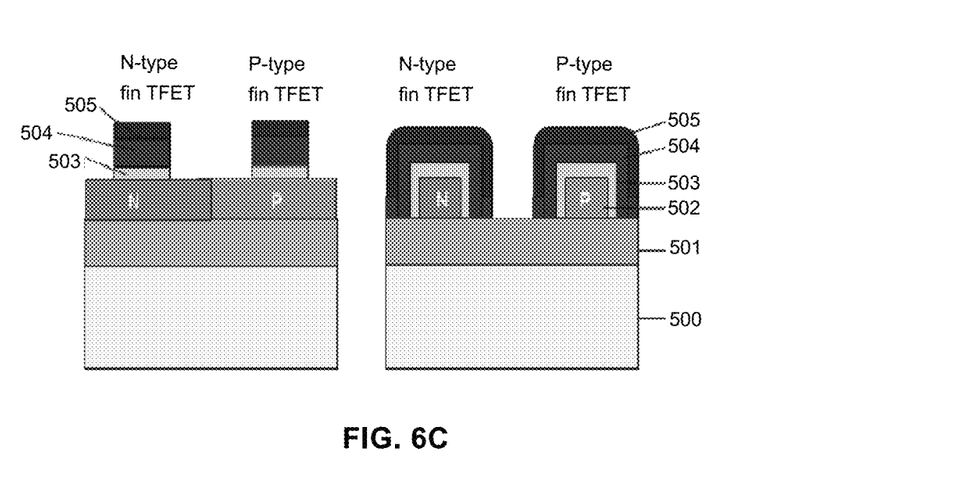

Next, referring to FIG. 6C, a gate oxide material 503' is deposited over the substrate. Specifically, the gate oxide material 503' is formed covering the semiconductor body 502 (channel) in each of the N-type fin TFET and the P-type fin TFET. Next, the gate oxide material 503' is etched through a mask (not shown), so as to remove portions of the gate oxide material 503' that are located away from the semiconductor body 502. Accordingly, a gate oxide 503 is formed on a portion of the top surfaces of the semiconductor body 502, and on the sidewalls of the semiconductor body 502.

A gate 504 is then formed on the gate oxide 502 surrounding the semiconductor body 502 (channel) in each of the N-type fin TFET and the P-type fin TFET. In the example of FIG. 6C, the gate 504 is formed surrounding three sides of the channel, as shown in the right cross-sectional view of FIG. 6C. However, the inventive concept is not limited thereto. In other embodiments, the gate 504 may be formed on only two sides of the channel or completely surrounding the channel. The gate 504 may be formed in any configuration so long as it forms a three-dimensional structure. The gate 504 may be formed of a metal, for example, NiAu or CrAu.

The gate oxide 503 serves to insulate the gate 504 from the channel. In one embodiment, the gate oxide 503 may be a high-k oxide. Accordingly, in the above embodiment, an insulated gate is formed on the channel.

In some particular embodiments, the gate oxide 503 may be omitted.

The gate oxide material 503' and gate 504 may be deposited using low pressure chemical vapor deposition (LPCVD). For example, LPCVD may be used to uniformly deposit a layer over an isotropic surface pattern. Also, physical vapor deposition (PVD) may be used to form sidewalls on an anisotropic surface pattern. Etching may include etching techniques known to those skilled in the art. For example, the etching may include a vertical anisotropic etching method such as reactive ion etching (RIE).

In one embodiment, the gate 504 may be formed using sidewall image transfer techniques.

As shown in FIG. 6C, a gate hard mask 505 is formed over the gate 504 in each of the N-type fin TFET and the P-type fin TFET.

Figure 6D:
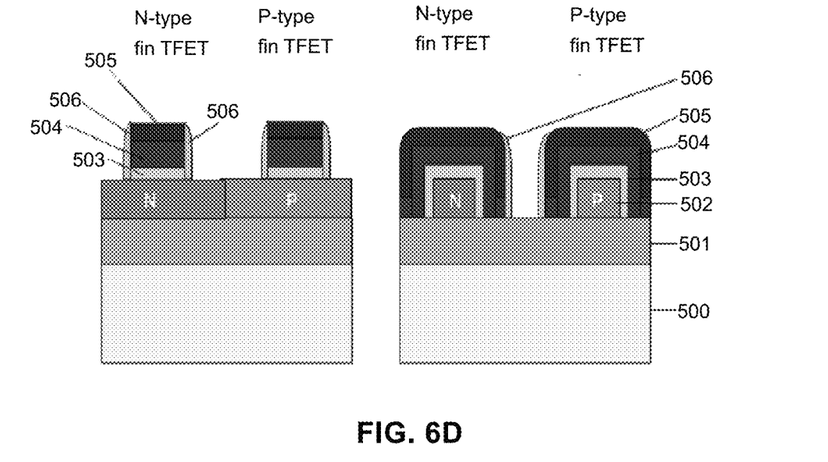

Referring to FIG. 6D, a spacer layer 506' is deposited on the gate hard mask 505 over the semiconductor body 502. The spacer layer 506' is then etched (using, for example, reactive ion etching) to form spacers 506 on the sidewalls of the fins. Since the RIE etching is directional (typically vertical), the top and bottom portions of the spacer layer 506' will be removed whereas the sidewall portions of the spacer layer 506' will remain.

The spacers 506 are formed on the sidewalls of the semiconductor body 502 (channel) of the respective N-type fin TFET and the P-type fin TFET. The spacers 506 can protect the fins during subsequent epitaxial growth of source/drain 507 and 508 (shown in FIGS. 6F through 6H). The spacers 506 can also reduce parasitic resistance at the end portions of the source/drain 507 and 508. In one embodiment, the spacers 506 may be formed of an oxide.

In the example of FIG. 6D, the spacers 506 are formed on one side of the fin of the N-type fin TFET, and on one side of the fin of the P-type fin TFET, with the two sides disposed opposite each other. Accordingly, the spacers 506 are disposed opposite each other, as shown in the right cross-sectional view in FIG. 6D.

In some particular embodiments, the spacers 506 may be omitted. For example, spacers 506 need not be formed when there is only a single fin TFET.

Figure 6E:
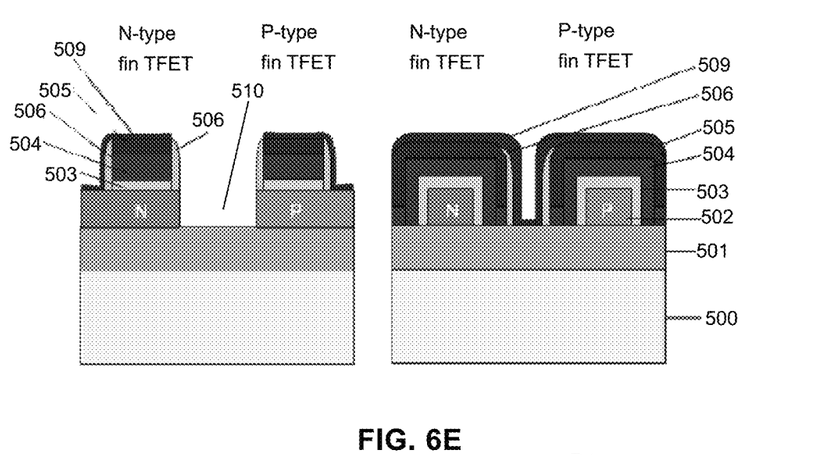

Next, referring to FIG. 6E, a first epitaxial barrier layer 509' is deposited and patterned to form a first epitaxial barrier 509. A portion of the semiconductor body 502 is then etched through the first epitaxial barrier 509 to form a recess 510 between the N-type fin TFET and the P-type fin TFET. The recess 510 is disposed between the channels of the N-type fin TFET and the P-type fin TFET. The semiconductor body 502 may be etched using dry etching.

Figure 6F:
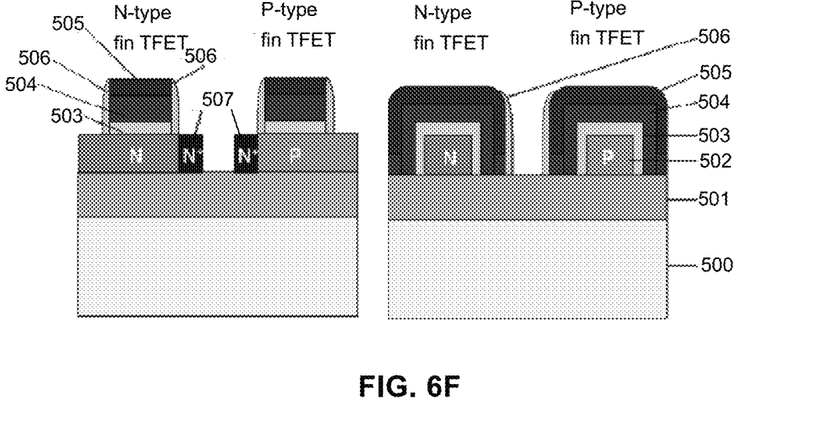

Next, referring to FIG. 6F, a source/drain 507 is epitaxially grown in the recess 510. The source/drain 507 may be doped with a first dopant type, for example, N-type. The source/drain 507 may be formed of Ge or SiGe. The source/drain 507 may be epitaxially grown using Metal Organic Chemical Vapor Phase Deposition (MOCVD) or other methods. Since the source/drain 507 is epitaxially grown adjacent to a sidewall of the channel, a surface of the source is thus formed in direct contact with the channel.

During epitaxial growth of the source/drain 507, appropriate doping is carried out depending on the device type (N-type fin TFET or P-type fin TFET), so as to reduce contact resistance at the end portions of the source/drain 507. For example, an $N^+$ dopant may be implanted using an ion implantation method. The $N^+$ dopant may include $Si^+$. A concentration of the $N^+$ dopant may range from about $1\times10^{15}$ cm$^{-3}$ to about $5\times10^{16}$ cm$^{-3}$. An energy dosage of the ion implantation may range from about 2 keV to about 50 keV.

In one embodiment, the contacts to the source/drain 507 may be silicized so as to further reduce contact resistance.

After the source/drain 507 has been epitaxially grown, the first epitaxial barrier 509 is removed.

Figure 6G:
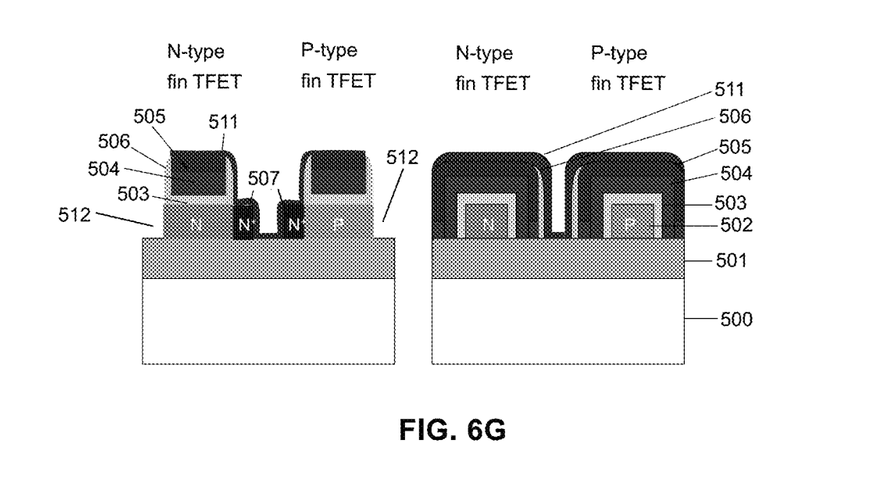

Next, referring to FIG. 6G, a second epitaxial barrier layer 511' is deposited and patterned to form a second epitaxial barrier 511. A portion of the semiconductor body 502 is then etched through the second epitaxial barrier 511 to form recesses 512 in the N-type fin TFET and the P-type fin TFET. The recesses 512 are disposed on the side of the channel opposite to the source/drain 507 in each of the N-type fin TFET and the P-type fin TFET. The semiconductor body 502 may be etched using dry etching.

Figure 6H:
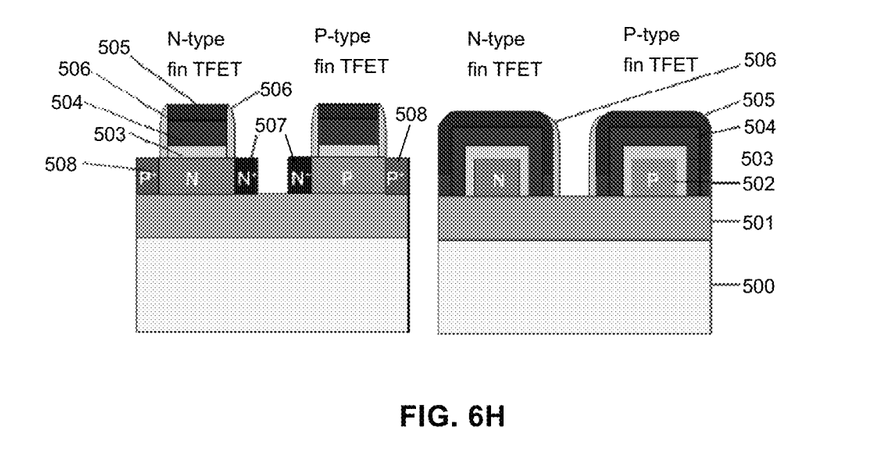

Next, referring to FIG. 6H, a source/drain 508 is epitaxially grown in the recesses 512. The source/drain 508 may be doped with a second dopant type, for example, P-type. The source/drain 508 may be formed of Ge or SiGe. The source/drain 508 may be epitaxially grown using MOCVD or other methods. Since the source/drain 508 is epitaxially grown adjacent to a sidewall of the channel, a surface of the source is therefore formed in direct contact with the channel.

During epitaxial growth of the source/drain 508, appropriate doping is carried out depending on the device type (N-type fin TFET or P-type fin TFET), so as to reduce contact resistance at the end portions of the source/drain 508. For example, a $P^+$ dopant may be implanted using an ion implantation method. The $P^+$ dopant may include $Mg^+$. A concentration of the $P^+$ dopant may range from about $1\times10^{15}$ cm$^{-3}$ to about $5\times10^{16}$ cm$^{-3}$. An energy dosage of the ion implantation may range from about 2 keV to about 10 keV.

In one embodiment, the contacts to the source/drain 508 may be silicized so as to further reduce contact resistance.

After the source/drain 508 has been epitaxially grown, the second epitaxial barrier 511 is removed.

In one embodiment, a concentration of the $N^+$ dopant in the source/drain 507 and a concentration of the $P^+$ dopant in the source/drain 508 may each be greater than $1\times10^{19}$ cm$^{-3}$.

In one embodiment, an annealing process may be performed after the ion implantation, so as to improve the performance of the device.

In the above method, the source/drain 507 (N-doped) is formed prior to forming the source/drain 508 (P-doped). However, it should be noted that the sequence for forming the N-doped source/drain and the P-doped source/drain need not be limited to the above. In one embodiment, the P-doped source/drain may be formed before forming the N-doped source/drain. In another embodiment, the N-doped source/drain and the P-doped source/drain may be formed simultaneously.

Likewise, the sequence for forming the gate 504 and the source/drain 507 and 508 is not limited to the above. For example, in one embodiment, the gate 504 may be formed after forming the source/drain 507 and 508.

In the above embodiment, when the source/drain 507 is N-type and the source/drain 508 is P-type, the P-type fin TFET will have a source 507 and a drain 508, and the N-type fin TFET will have a source 508 and a drain 507. Alternatively, when the source/drain 508 is N-type and the source/ drain 507 is P-type, the P-type fin TFET will have a source 508 and a drain 507, and the N-type fin TFET will have a source 507 and a drain 508.

In one embodiment (not shown), an interlayer dielectric (ILD) is deposited and planarized, and contacts are formed, so that the fin TFET may be used with other semiconductor devices.

In one embodiment (not shown), shallow trench isolation (STI) structures may be formed between the N-type fin TFET and the P-type fin TFET. The STI structures may be formed of an oxide material.

Accordingly, a complementary fin TFET can be formed using the method described above with reference to FIGS. 6A through 6H.

Embodiments of a fin TFET and a method of forming the fin TFET have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A method of manufacturing a complementary fin tunneling field effect transistor (TFET) comprising an N-type fin TFET and a P-type fin TFET, the method comprises:
   providing a substrate;
   forming an N-type semiconductor body and a P-type semiconductor body extending in a first direction on the substrate, wherein the N-type semiconductor body constitutes a channel of the N-type fin TFET, the P-type semiconductor body constitutes a channel of the P-type fin TFET;
   forming a first gate on three sides of the channel of the N-type fin TFET;
   forming a second gate on three sides of the channel of the P-type fin TFET;
   forming a first spacer on one side of a fin of the N-type fin TFET;
   forming a second spacer on one side of a fin of the P-type fin TFET, wherein the first spacer and the second spacer are disposed opposite each other;
   forming a first recess between the N-type fin TFET and the P-type fin TFET;
   forming a first source/drain region doped with a first dopant type in the first recess, wherein the first source/drain region comprises a first part and a second part separated from the first part, with the first part and the second part formed by a same epitaxial growth process, the first part directly contacting a first end of the channel of the N-type fin TFET, and the second part directly contacting a first end of the channel of the P-type fin TFET; and
   forming a second source/drain region doped with a second dopant type different from the first dopant type, wherein the second source/drain region comprises a first part and a second part separated from the first part, with the first part directly contacting a second end of the channel of the N-type fin TFET opposite to the first end of the channel of the N-type TFET, and the second part directly contacting a second end of the channel of the P-type fin TFET opposite to the first end of the channel of the P-type fin TFET.

2. The method according to claim 1, wherein the channel of the N-type fin TFET and the channel of the P-type fin TFET are doped.

3. The method according to claim 1, further comprising:
   forming a gate oxide between the first gate and the channel of the N-type fin TFET, and between the second gate and the channel of the P-type fin TFET.

* * * * *